United States Patent [19]
Roohparvar

[11] Patent Number: 5,864,569
[45] Date of Patent: Jan. 26, 1999

[54] METHOD AND APPARATUS FOR PERFORMING ERROR CORRECTION ON DATA READ FROM A MULTISTATE MEMORY

[75] Inventor: Frankie F. Roohparvar, Cupertino, Calif.

[73] Assignee: Micron Technology, Inc., Boise, Id.

[21] Appl. No.: 731,406

[22] Filed: Oct. 18, 1996

[51] Int. Cl.[6] ............................ G11C 29/00; G11C 16/04
[52] U.S. Cl. .................................. 371/40.18; 365/185.03
[58] Field of Search ............................. 371/40.11, 40.18; 365/185.03, 185.09

[56] References Cited

U.S. PATENT DOCUMENTS

| | | | |
|---|---|---|---|
| 4,701,884 | 10/1987 | Aoki et al. ............................... | 365/189 |
| 5,043,940 | 8/1991 | Harari ....................................... | 365/168 |
| 5,233,610 | 8/1993 | Nakayama et al. ...................... | 371/5.1 |
| 5,394,362 | 2/1995 | Banks ..................................... | 365/189.1 |
| 5,450,354 | 9/1995 | Sawada et al. .......................... | 365/185 |
| 5,450,363 | 9/1995 | Christopherson et al. ............. | 365/205 |
| 5,475,693 | 12/1995 | Christopherson et al. ............. | 371/10.2 |
| 5,621,682 | 4/1997 | Tanzawa et al. ....................... | 365/185.09 |
| 5,729,489 | 3/1998 | Fazio et al. ............................ | 365/185.03 |

*Primary Examiner*—Stephen M. Baker
*Attorney, Agent, or Firm*—Schwegman, Lundberg, Woessner & Kluth, P.A.

[57] ABSTRACT

A method for performing error correction on data read from a multistate memory array, by encoding data read from each memory element of the array, detecting an error in the encoded data from one memory element, and correcting the error by changing X bits of the encoded data (preferably X=1), and a multistate memory system for performing the method. Preferably the system is a circuit in which each memory element is a flash memory cell. The invention enables implementation of error detection and correction while requiring storage of fewer ECC check bits (with the data of interest) than the number of ECC check bits that would need to be stored in accordance with the prior art. In accordance with the invention, a data bit is read from each memory cell by asserting a signal having a signal value in a value range, where the value range is a member of a sequence of non-overlapping value subranges $L_iH_i$, where N is the number of states of each memory element, and N is equal to at least 3, and the value subranges are determined by values $L_i$ and $H_i$ satisfying $L_1<H_1<L_2<H_2< \ldots <L_N<H_N$. Each value subrange $L_iH_i$ includes values $x_i$, where $L_i<x_i<H_i$. For each bit (identified by subrange $L_iH_i$) read from a memory cell, an encoded data signal $E_i$ is generated. Each encoded signal $E_i$ is indicative of an ordered set of bits (preferably binary bits). Encoded signal $E_m$ is not identical to encoded signal $E_n$ where "m" and "n" are different integers in the range from 1 through N. For each pair of encoded signals $E_{j-1}$ and $E_j$ (where j is an integer in the range from 2 to N) indicative respectively of first and second ordered sets of bits, the second ordered set is generated by changing X bits (preferably, X=1) of the first ordered set.

22 Claims, 4 Drawing Sheets

METHOD AND APPARATUS FOR PERFORMING ERROR CORRECTION ON DATA READ FROM A MULTISTATE MEMORY

BACKGROUND OF THE INVENTION

1. Field of the Invention

The present invention relates to methods and apparatus for performing error correction on data read from memory systems (preferably integrated flash memory circuits) which are "multistate" systems in the sense that each memory cell has more than two states (each state determining a different data value). More particularly, the invention is a method and apparatus for performing error correction on data read from a multistate memory system (preferably a flash memory circuit), in which the data read from each memory cell is encoded so that in response to detection of an error in the encoded data from one memory cell, the error is corrected by changing one bit of the encoded data.

2. Description of Related Art

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Multistate memory systems are becoming increasingly commercially important. Such systems include one or more arrays of memory elements, with each memory element having more than two states (each state determining a different data value). The synonymous terms "cell" of a memory array and "element" of a memory array are used interchangeably herein. A flash EEPROM multistate memory system is described in U.S. Pat. No. 5,043,940, issued Aug. 27, 1991, and an electrically alterable nonvolatile multistate memory system is described in U.S. Pat. No. 5,394,362 issued Feb. 28, 1995.

Throughout the specification, including in the claims, the term "bit" is used herein to denote the data stored in one memory element of a memory system (which can be either a multistate memory system or a two-state memory system). In the special case of a two-state memory system, each element stores a "binary" bit (whose value can be denoted by the binary representation "0" or "1"). In the special case of a four-state memory system, each element stores a bit having one of four possible values (which can be denoted by the binary representations "00", "01", "10", and "11")

It has been proposed to design nonvolatile memory chips (integrated circuits) as multistate memory systems, so each memory element ("cell") of such a system has more than two states. Since analog values can be stored on the floating gate of a typical nonvolatile memory cell (e.g., a flash memory cell), it is possible to define more than two states for each such cell and hence reduce the area per stored bit for each cell. It is predictable that improved technology will continue to reduce the practical size of memory cells and that in some designs, a cell will be implemented as an intersection of two poly elements.

A problem with multistate storage is that by putting more states on each cell, the effective voltage range for each state becomes smaller. E.g., for a 5 volt window of operation on a floating gate (this window being determined by the particular circuitry used to "read" the cell), one can define the midpoint to be the boundary (or threshold) between the two states. Thus, a voltage stored on the gate determines a first state (corresponding to a first binary bit) if it is detected to be in the upper 2.5 volts of the window, and a voltage stored on the gate determines a second state (corresponding to a second binary bit) if it is detected to be in the lower 2.5 volts of the window. However, if a "read" circuit having the same window is used to distinguish between four states of the floating gate, each state corresponds to only 1.25 volts of the window. So, the noise margin for each state (e.g., the maximum range of voltage change, from the center of the window portion for the state, before the state is no longer valid) is reduced by a factor of two when the floating gate is used as four-state cell rather than a two-state cell.

There is also a limit to the precision with which circuitry can store an analog value on the floating gate of a nonvolatile memory cell. With today's architectures and high densities, cells across a nonvolatile memory array do not all behave identically. For these reasons, conventional circuitry for performing a program or erase of the bits in a nonvolatile memory array is typically designed to perform the task in an algorithmic manner in which the circuitry asserts an appropriate voltage level to a cell, then interrogates the value of the cell, and if the cell has not yet developed a sufficient margin, the circuitry again asserts an appropriate voltage level thereto. Using such circuitry, incremental varying of the voltage on a floating gate of each cell is not difficult, so that multistate storage becomes feasible.

To reduce the cost of nonvolatile memory systems, defective memory arrays can be tolerated and error correction employed to regain the data integrity. If one allows memory arrays having a few bad elements to be used in a system, the price of the system can be substantially reduced since much greater manufacturing yield can be attained. In order to enable the reader to more readily appreciate the present invention, we next describe (with reference to FIGS. 1 and 2) a nonvolatile memory system having conventional design, which includes conventional error detection and correction circuitry, including ECC encoder 40, ECC decoder 41, error correction unit 42, and syndrome decoder 43 (of FIG. 1).

Nonvolatile memory chip 3 of FIG. 1 includes an array 16 of nonvolatile memory cells, each cell comprising a transistor having a floating gate capable of semipermanent charge storage. The current drawn by each cell depends on the amount of charge stored on the corresponding floating gate. Thus, the charge stored on each floating gate determines a data value that is stored "semipermanently" in the corresponding cell.

In one particularly useful implementation of memory chip 3, each cell of array 16 comprises a flash memory device (a transistor). The charge stored on the floating gate of each flash memory device (and thus the data value stored by each cell) is erasable by appropriately changing the voltage applied to the gate and source (in a well known manner).

As shown in FIG. 1 (a simplified block diagram of nonvolatile memory chip 3), chip 3 includes a host interface 10 (including an I/O buffer for input data received from an external device and output data to be asserted to an external device), an address buffer 30, row decoder circuit (X address decoder) 12, column multiplexer circuit (Y multiplexer) 14, memory array 16 (comprising columns of nonvolatile memory cells, such as column 16A), sense amplifier circuit 15, and control unit 29.

Address bits received at interface 10 from an external device are asserted to address buffer 30. In response to a set of address bits A0 through Ap received from an external device, address bits A0 through An are asserted from buffer 30 to X decoder 12, and address bits An+1 through Ap are asserted from buffer 30 to Y multiplexer 14.

Chip 3 executes a write operation by receiving data bits (to be written to memory array 16) from an external device at interface 10, buffering the data in interface 10, including ECC check bits with the data (in unit 40), and then writing the data (and ECC check bits) to the appropriate memory cells of array 16. Chip 3 can also be controlled to execute a read operation in which data that has been read from array 16 undergoes error detection and correction in units 41, 42, and 43, and the corrected data is then buffered in interface 10 and asserted to the external device.

Since the cells of array 16 are flash memory cells, data is typically written to cells which have been erased. Each cell is either allowed to remain in the erased state, or is programmed to a desired state (a single programmed state when array 16 is operated as a binary memory, and a selected one of at least two different programmed states when array 16 is operated as a multistate memory) by applying appropriate voltages to the source, drain, and control gate of the cell for an appropriate time period (using write driver circuitry within circuit 14). This causes electrons to tunnel or be injected from a channel region to a floating gate. The amount of charge residing on the floating gate determines the voltage required on the control gate in order to cause the cell to conduct current between the source and drain regions.

In typical implementations, the FIG. 1 system is designed so that when it executes a write or read operation, it processes multiple bits of data in parallel. When executing a write operation with such an implementation of the system, sets of X bits of input data (where X is an integer greater than one) are received in parallel at ECC encoder 40, and encoder 40 generates M check bits for each X-bit set of data (typically X=8, and M=4). It is irrelevant to operation of ECC encoder 40 whether each set of X binary data bits that encoder 40 receives is to be stored in a single cell of array 16 (as where array 16 is operated as a multistate memory) or in X different cells of array 16 (as where each cell of array 16 is operated as a binary memory device). Encoder 40 asserts each set of X+M data and check bits in parallel to circuit 14 which causes them (or a sequence of subsets of them) to be written in parallel to cells of array 16 determined by corresponding address bits supplied to circuits 12 and 14. When each cell of array 16 is operated as a multistate device having four states, the write driver circuitry within circuit 14 writes two bits (two data bits or two check bits) in each cell by placing the cell in one of three programmed states (or allowing the cell to remain in an erased state).

When executing a read operation with the implementation of the FIG. 1 system described in the previous paragraph, the system reads Z-bit sets of cells in parallel (Z is an integer, typically equal to four or eight). In reading such a set of cells, sense amplifier circuit 15 outputs ZN binary bits indicative of the data stored in the Z cells (where each cell has one of $2^N$ states). S-bit subsets of each set of ZN binary bits are asserted in parallel from circuit 15 to ECC decoder 41 (where S can be equal to or less than ZN. Decoder 41 generates T syndrome bits from each ZN-bit set that it receives (typically T=M) and asserts the syndrome bits in parallel to syndrome decoder 43. Decoder 41 also asserts a set of P binary bits of uncorrected data to correction unit 42. The uncorrected data bits may be identical to the P input data bits written to the cells being read, or they may differ (by one or more erroneous bits) from the P input data bits. Syndrome decoder 43 decodes the syndrome bits to generate a set of P correction bits in response to each set of syndrome bits that is indicative of one or more correctable errors, and decoder 43 asserts such set of correction bits in parallel to correction unit 42. Unit 42 processes each set of correction bits with the corresponding set of uncorrected bits to generate a set of P corrected bits, and asserts the corrected bits to interface 10 (to enable them to be asserted to an external device). Each set of corrected bits output from unit 42 bits comprises original data bits (data bits in the bit stream received by unit 41 which were determined not to be erroneous) and replacement data bits (bits which replace those data bits in the bit stream received by unit 41 which were determined to be erroneous).

Typically, decoder 43 includes circuitry for asserting a failure signal in response to a set of syndrome bits indicative of non-correctable errors in the corresponding set of uncorrected data. Such failure signal is fed back to control unit 29 (to cause unit 29 to assert appropriate status and control signals in response thereto) and/or asserted to interface 10 (for transmission to an external device).

Each of the cells of memory array circuit 16 is indexed by a row index (an "X" index determined by decoder circuit 12) and a column index (a "Y" index output determined by multiplexer circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, . . . , Nn. The drain of each of transistors N1-Nn is connected to bitline 13, and the gate of each is connected to a different wordline (a different one of wordline 0 through wordline n). The column on the right side of FIG. 2 also comprises "n" memory cells, each cell implemented by one of floating-gate N-channel transistors N2, N4, . . . , Nm. The drain of each of transistors N2–Nm is connected to bitline 23, and the gate of each is connected to a different wordline (a different one of wordline 0 through wordline n). The source of each of transistors N1, N3, . . . , Nn, and N2, N4, . . . , Nm is held at a source potential (which is usually ground potential for the chip during a program or read operation).

Each of transistors N1, N3, . . . , Nn, and N2, N4, . . . , Nm has a floating gate capable of semipermanent charge storage. The current drawn by each cell (i.e., by each of transistors N1, N3, . . . , Nn, and N2, N4, . . . , Nm) depends on the amount of charge stored on the corresponding floating gate. Thus, the charge stored on each floating gate determines a data value that is stored semipermanently in the corresponding cell. In cases in which each of transistors N1, N3, . . . , Nn, N2, N4, . . . , and Nm is a flash memory device (as indicated in FIG. 2 by the symbol employed to denote each of transistors N1, N3, Nn, N2, N4, . . . , and Nm), the charge stored on the floating gate of each is erasable (and thus the data value stored by each cell is erasable) by appropriately changing the voltage applied to the gate and source (in a well known manner).

In response to each set of address bits $A_{n+1}$–$A_p$, circuit 14 (of FIG. 1) determines a column address which selects one (or a set of two or more) of the columns of cells of array 16 (connecting the bitline of the selected column to Node 1 of FIG. 1), and in response to address bits $A_0$–$A_n$, circuit 12 (of FIG. 1) determines a row address which selects one cell in each selected column. Consider an example in which the column address selects the column on the right side of FIG. 2 (the column including bitline 23) and the row address selects the cell connected along wordline 0 (the cell comprising transistor N2). To read the data value stored in the selected cell, a signal (a current signal) indicative of such value is provided from the cell's drain (the drain of . . . , transistor N2, in the example), through bitline 23 and circuit 14, to Node 1 of FIG. 1. To write a data value to the selected cell, appropriate voltages are provided to the cell's source, gate, and drain.

More specifically, chip 3 of FIG. 1 executes a read operation as follows. In response to a read command (supplied from control unit 29, or from an external device through interface 10), a current signal indicative of data values stored in the cells of array 16 (a "data signal") determined by the current row and column addresses is supplied from the drain of each selected cell through the bitline of each selected cell and then through circuit 14 to sense amplifier 15. This data signal is processed in amplifier 15 (in a manner to be described below), the output of amplifier 15 undergoes error detection and correction in circuits 41, 42, and 43, and the corrected data output from unit 42 is asserted to interface 10.

The following description of the manner in which sense amplifier 15 and units 41, 42, and 43 process the data signal from each selected cell of array 16 applies to an operating mode of chip 3 in which chip 3 operates as a two-state memory system (so that each cell of array 16 determines a binary bit). A predetermined voltage is applied to the control gates of each selected cell of array 16 and the cells are read (i.e., the predetermined voltage is applied to all or selected ones of the wordlines of array 16 and the cells connected to such wordlines are read) using sense amplifier 15. If a selected cell is in an erased state, the cell conducts a first current and the data signal indicative of this current is converted to a first voltage in sense amplifier 15. If the selected cell is in the other state (the programmed state), it conducts a second current and the data signal indicative of this current is converted to a second voltage in sense amplifier 15 (the "second current" flowing through a programmed cell is negligibly small when the cell is read by a typical, conventional read operation). Sense amplifier 15 determines the state of each selected cell (i.e., whether it is programmed or erased corresponding to a binary value of 0 or 1, respectively) by comparing the voltage indicative of the cell state to a reference voltage. The outcome of each such comparison (an output which is either high or low, corresponding to a binary value of one or zero) is sent from sense amplifier 15 to ECC decoder 41. In response, decoder 41 and circuits 42 and 43 operate in the manner described above to assert a set of error-corrected data bits to interface 10 (unless decoder circuit 43 determines that the bits output from sense amplifier 15 contain uncorrectable errors, in which case decoder circuit 43 asserts the above-described "failure signal").

Circuits 40, 41, 42, and 43 implement any conventional error detection and correction operation (many such operations are well known).

U.S. Pat. No. 5,233,610, issued on Aug. 3, 1993, describes a non-volatile memory system which includes an array of memory cells and conventional circuitry for generating ECC check bits, writing the ECC check bits to an array with corresponding data bits of interest, and performing error detection and correction on data read from the array. The disclosure of U.S. Pat. No. 5,233,610 is incorporated herein by reference.

In conventional two-state memory systems, it is known to employ an ECC encoder (e.g., unit 40) and error detection and correction circuitry (e.g., units 41–43) to detect errors in single binary bits (each binary bit indicative of the state of one memory cell) and to correct each detected error by changing each erroneous binary bit. It had not been known until the present invention how efficiently to implement error correction in a multistate memory system.

Memory chip 3 of FIG. 1 can also execute an erase operation in which all or selected ones of the cells of memory array 16 are erased in response to a sequence of one or more commands (e.g., an "Erase Setup" command followed by an "Erase Confirm" command), by discharging a quantity of charge stored on the floating gate of each cell. Typically, all cells of array 16 or large blocks of such cells are erased at the same or substantially the same time during an erase operation. Each erase operation comprises a sequence of steps, including verification steps for verifying that the cells have desired threshold voltages at each of one or more stages of the erase operation.

More specifically, if cells of memory array 16 of FIG. 1 are to be erased, an "Erase Setup" command and then an "Erase Confirm" command are sent from an external device to interface 10. The commands are transferred from interface 10 to control unit 29. Control unit 29, which typically includes command execution logic and a state machine, processes the command to generate instruction data, and supplies the instruction data to circuit 14 and sense amplifier 15 (and to other components of memory chip 3 of FIG. 1) to cause chip 3 to execute a sequence of steps required for erasing the specified cells of array 16. These steps typically include verification steps for verifying that one or more of the cells have desired threshold voltages at each of one or more stages of the erase operation.

A conventional memory erase operation, of the type implemented by a memory system identical in relevant respects to chip 3 of FIG. 1, is described in greater detail in U.S. patent application Ser. No. 08/506,970, filed Jul. 28, 1995 (and assigned to the assignee of the present application), the disclosure of which is incorporated herein in full by reference.

Although conventional error detection and correction of the type implemented by ECC encoder 40 and error detection and correction circuitry 41–43 of FIG. 1 is desirable in two-state memory systems (for the reason noted above) it is even more desirable to implement error detection and correction in multistate memory systems due to the reduced noise margin per state in the latter systems (as noted above). However, to do so requires using some of the cells of the array to store ECC check bits, which reduces the array's effective capacity for storing data bits of interest. The present invention is based on the inventor's recognition that:

1. the effective capacity of a memory array (operated as an array of multistate cells) can be maximized by minimizing the number of ECC check bits that must be stored with any given number of data bits to enable performance of error detection and correction on the data after it has been stored in the array; and 2. if a specially chosen encoding method is employed to generate encoded data fields (each field typically consisting of two or more binary bits) which represent data (and ECC check bits) read from each of a set of multistate memory cells, error detection and correction can be performed on the data (after it has been read from the cells) in a manner requiring storage of a minimal number of ECC check bits with the data of interest.

Until the present invention, it had not been known to design or operate a multistate memory system to implement error detection and correction efficiently, in a manner minimizing the number of ECC check bits that must be stored with the data of interest to enable performance of the error detection and correction.

SUMMARY OF THE INVENTION

In a class of embodiments, the invention is a method for performing error correction on data read from a memory array of a multistate memory system (a system in which each memory element has more than two states, each determining a different stored bit of data). The method includes the steps of encoding data read from each memory element of the array, detecting an error in the encoded data from one memory element, and correcting the error by changing a selected number of bits (one bit, in preferred embodiments) of the encoded data. The memory system is preferably an integrated memory circuit including a flash memory array. A multistate memory system designed to perform the inventive method can implement error detection and correction (on data read from its array of memory cells) in a manner that requires storage of a minimal number of ECC check bits with the data of interest, and thus such a system can be implemented with an array of fewer cells than would be needed if it were necessary to store more ECC check bits with the data of interest in order to implement error detection and correction on the data.

In accordance with the invention, a data bit is read from each memory cell by asserting a signal (e.g., an analog voltage or current signal) indicative of the cell's state, where the signal has a signal value in a value range, and where the value range is a member of a sequence of consecutively increasing but non-overlapping value subranges $L_iH_i$, where "i" is an integer in the range from 1 through N (where N is the number of states of each memory cell, and N is equal to at least 3), and the value subranges are determined by low values $L_i$ and high values $H_i$ satisfying $L_1 < H_1 < L_2 < H_2 < \ldots < L_N < H_N$. Each value subrange $L_iH_i$ includes values $x_i$, where $L_i < x_i < H_i$. For each bit (identified by signal value subrange $L_iH_i$) read from a memory element, an encoded data signal $E_i$ is generated. Each encoded signal $E_i$ is indicative of an ordered set of bits (preferably binary bits). The encoded data signals $E_i$ satisfy the following criteria: $E_m$ is not identical to $E_n$ where "m" and "n" are different integers in the range from 1 through N; and for each pair of encoded signals $E_{j-1}$ and $E_j$ (where j is an integer in the range from 2 to N) indicative respectively of a first ordered set of bits and a second ordered set of bits, the second ordered set is generated by changing one bit of the first ordered set. In alternative embodiments, for each pair of encoded signals $E_{j-1}$ and $E_j$ (where j is an integer in the range from 2 to N) indicative respectively of a first ordered set of bits and a second ordered set of bits, the second ordered set is generated by changing X bits of the first ordered set (where X is an integer other than one).

In a class of embodiments, each memory element has four states (N=4) and each signal $E_i$ is indicative of an ordered set of two binary bits as follows: $E_1$ is indicative of 00; $E_2$ is indicative of 01; $E_3$ is indicative of 11; and $E_4$ is indicative of 10. In one preferred implementation, each memory element is a flash memory cell, each data bit read from one memory element is determined by an analog voltage signal in the range from 0 to 5 volts, and the four states of each cell are defined by the following subranges: $L_1=0$ volts, $H_1=1.2$ volts, $L_2=1.25$ volts, $H_2=2.45$ volts, $L_3=2.5$ volts, $H_3=3.7$ volts, $L_4=3.75$ volts, and $H_4=5.0$ volts.

In another class of embodiments, each memory element has eight states (N=8), and each encoded signal $E_i$ is indicative of an ordered set of three binary bits. In a preferred embodiment in this class, the encoded signals $E_1$, $E_2$, $E_3$, $E_4$, $E_5$, $E_6$, $E_7$, and $E_8$, are indicative of 000, 001, 011, 010, 110, 111, 101, and 100, respectively. In another preferred embodiment in this class, the encoded signals $E_1$, $E_2$, $E_3$, $E_4$, $E_5$, $E_6$, $E_7$, and $E_8$, are indicative of 000, 100, 101, 001, 011, 111, 110, and 010, respectively.

In other embodiments, the invention is an apparatus (preferably an integrated memory circuit) that includes circuitry for performing the inventive method. In preferred implementations, each memory cell of the inventive apparatus is a flash memory cell.

DETAILED DESCRIPTION OF THE PREFERRED EMBODIMENTS

Figure 1:
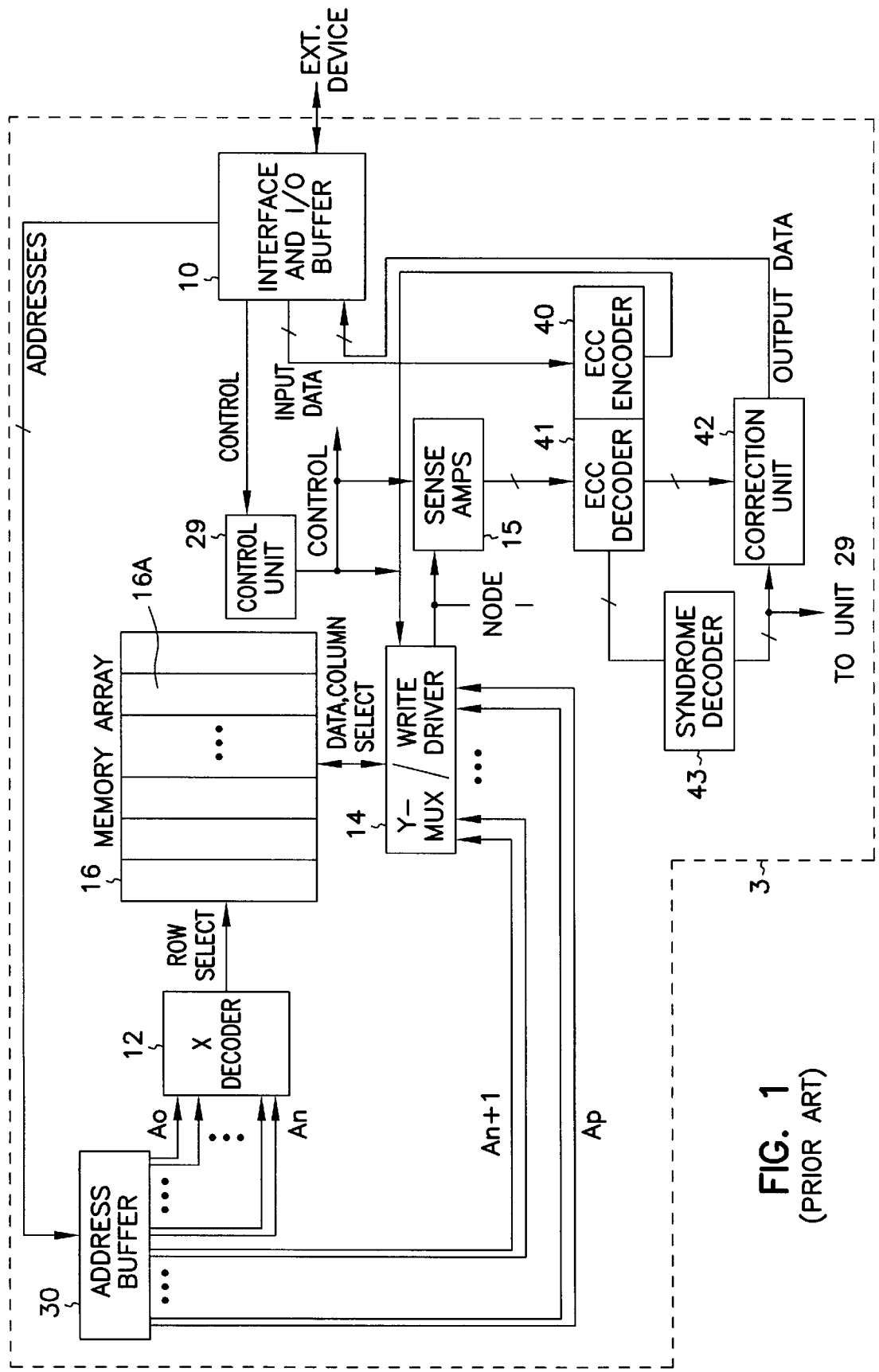
FIG. 1 is block diagram of a conventional memory circuit (implemented as an integrated circuit).
Figure 2:
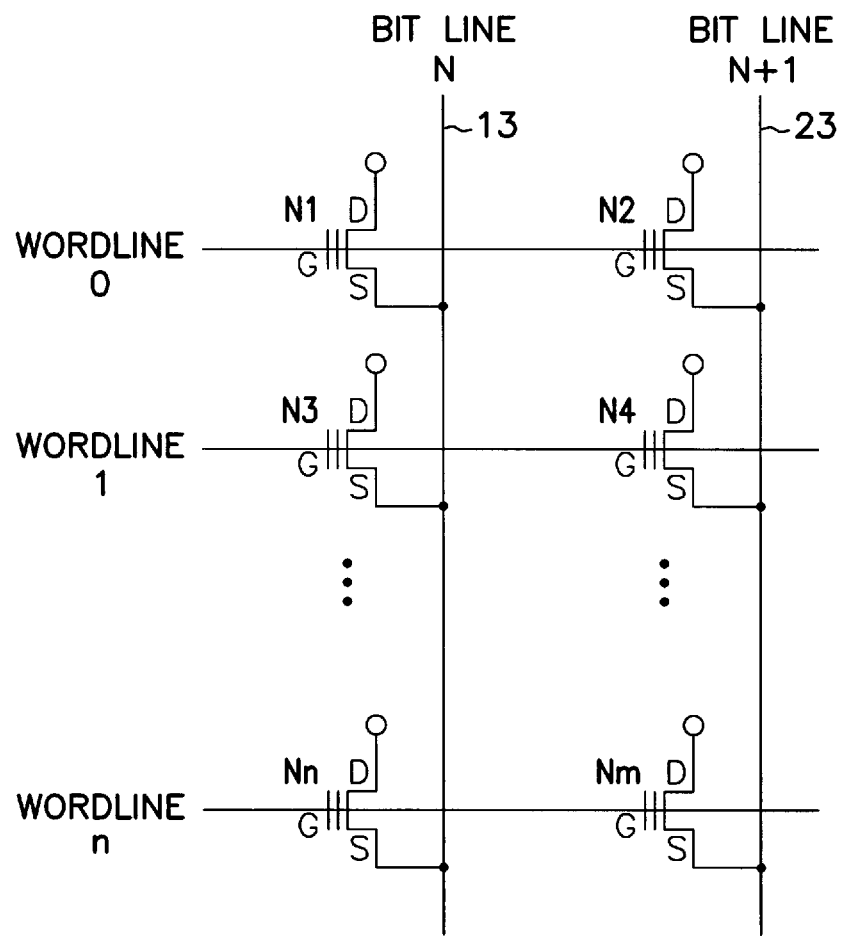
FIG. 2 is a simplified schematic diagram of two columns of memory cells of memory array 16 of FIG. 1.

Preferred embodiments of the inventive apparatus (and the error detection and correction method performed by each) will be described with reference to FIGS. 3 and 4. Each such apparatus is a memory system (identified by reference numeral 3' in FIG. 3) which includes array 16' of nonvolatile memory cells, sense amplifier 15' (including circuitry which generates encoded data bits representing data read from array 16' in accordance with the invention), and control unit 29' which controls operation of chip 3' in accordance with the invention. Array 16' of chip 3' is controlled to operate as a multistate memory array (control unit 29' is programmed to implement multistate memory programming and erasing operations, and chip 3' includes sources of appropriate voltages for programming each cell of array 16' to one of at least two different programmed states and erasing each cell to an erased state distinct from the programmed states).

Figure 3:
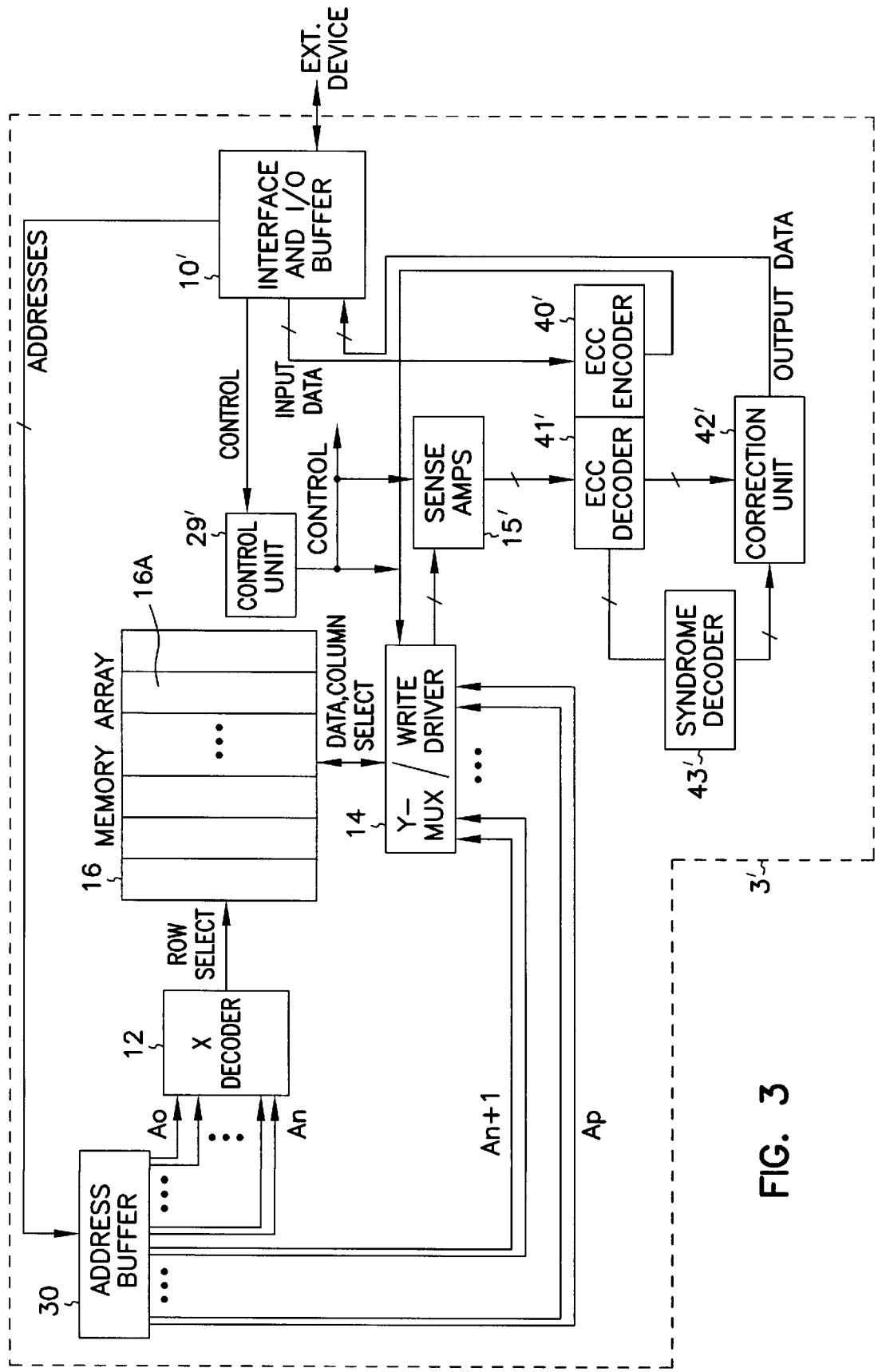
FIG. 3 is a block diagram of a memory circuit (implemented as an integrated circuit) which embodies the present invention.

Memory chip 3' of FIG. 3 is identical to conventional memory chip 3 of FIG. 1 (in implementations of chip 3 operating as a multistate system) except in the following respects: array 16' of chip 3' has fewer memory cells than does array 16 although both array 16' and array 16 can store the same number of data bits of interest (since fewer ECC check bits must be stored in array 16' to perform error detection and correction on data stored in array 16' than must be stored in array 16 to perform error detection and correction on the same set of data stored in array 16); chip 3' includes sense amplifier 15' (to be described with reference to FIG. 4) rather than sense amplifier 15; and chip 3' includes ECC encoder 40', ECC decoder 41', error correction unit 42', and syndrome decoder 43' rather than ECC encoder 40, ECC decoder 41, error correction unit 42, and syndrome decoder 43 of chip 3. Control unit 29' can be identical to control unit 29 of FIG. 1 (in the case that chip 3 of FIG. 1 is implemented as a multistate memory). Or, unit 29' differs from unit 29 only in that the former is programmed differently from the latter (in the case that chip 3 of FIG. 1 is implemented as a two-state memory).

The encoding scheme implemented by sense amplifier 15' (in accordance with the invention) allows use of circuits 41', 42', and 43' which perform error detection and correction of a type which requires fewer ECC check bits than are required by circuits 41, 42, and 43 of the FIG. 1 system (when the FIG. 1 system operates as a multistate memory system with a conventional sense amplifier 15 implementing a conventional encoding scheme). More specifically, the encoding circuitry within sense amplifier 15' outputs encoded data fields (each field consisting of two or more binary bits, and representing the contents of a single memory cell of array 16') which are encoded so that it is improbable that more than one bit per field will be erroneous.

Since the measured voltage indicative of state $E_i$ of a cell (of array 16 or 16') is determined by the charge stored on the cell's floating gate, an error would occur if there were a charge loss or gain from the floating gate. Assuming the charge loss (or gain) is very small, the measured voltage could rise or fall slightly to a value indicative of the next higher or next lower state ($E_{i+1}$ or $E_{i-1}$). If (as in preferred embodiments of the present invention), the encoded binary data field which determines state $E_{i+1}$ differs by only one bit from that determining state $E_i$ (and the encoded binary data field which determines state $E_{i-1}$ differs by only one bit from that determining state $E_i$), the number of ECC check bits needed to correct a small change in the floating gate voltage is minimized. As an example, in a multistate cell that has eight states (i.e., stores one of eight levels of charge, each level represented by three binary bits), a conventional scheme defines the states (in order of increasing level of charge) as 000, 001, 010, 011, 100, 101, 110, and 111. If the cell is programmed to state 100, and then (due to a small charge loss) changes state to state 011, all three bits of the representation of that cell's state undergo a change. In contrast, the states would be encoded (in accordance with the invention) in accordance with a different scheme in which the binary representations of successive states differ by a small, fixed number of bits (e.g., one bit or two bits). An error correction scheme to detect and correct three erroneous bits (per cell) requires many more ECC check bits than does a scheme to detect and correct one erroneous bit per cell.

The inventive system employs circuits 41', 42', and 43' which perform error detection and correction of a type which corrects only a low number of erroneous bits (per set of data fields) and assert a failure signal upon detecting more than such low number of erroneous bits (in one such set of data fields). Error detection and correction of this type requires that only a low number of ECC check bits are generated by ECC encoder 40' and stored in array 16' with the input data bits of interest.

In contrast, conventional sense amplifier 15 of the FIG. 1 system (when the FIG. 1 system operates as a multistate memory system) outputs encoded data fields (each field consisting of two or more binary bits, and representing the contents of a single memory cell of array 16) which are encoded so that it is much more likely that more than one bit per field will be erroneous. Thus, the conventional system of FIG. 1 requires performance of error detection and correction of a type which corrects a relatively large number of erroneous bits (per set of data fields) and asserts a failure signal upon detecting more than such relatively large number of erroneous bits (in one such set of data fields). Error detection and correction of this type requires that a relatively large number of ECC check bits are generated by ECC encoder 40 and stored in array 16 with the input data bits of interest.

Except for the difference between the particular encoding scheme implemented by sense amplifiers 15' and 15 (in generating each encoded field of data in response to a data signal for one memory cell), and the difference between the particular error correction detection and correction algorithm implemented by circuits 40–43 on the one hand and circuits 40'–43' on the other hand, circuits 15' and 40'–43' operate in the same manner as the above-described manner in which circuits 15 and 40–43 operate.

Only sense amplifier 15' (and the method implemented by chip 3' to read data from the cells of array 16' and perform error correction and detection thereon) will be described below, since the foregoing description of those elements of chip 3 (of FIG. 1) other than sense amplifier 15 (and the manner in which these elements operate) applies equally well to chip 3', and no purpose would be served by repeating it below. It is contemplated that in preferred embodiments of the inventive memory system, each memory cell in each memory array (e.g., each cell of nonvolatile array 16' of chip 3') is a flash memory cell.

Since chip 3' (of FIG. 3) is operated as a multistate memory system, the data read from each cell of array 16' cannot be represented by a single binary bit. Instead, an ordered set of at least two binary bits is required to represent the data read from each cell. The simplest (and least expensive) error detection and correction units suitable for implementing units 41', 42', and 43' are designed to process parallel streams of binary data. Thus, in preferred embodiments, sense amplifier 15' outputs parallel streams of binary bits, and the data read from each memory element of array 16' is determined by an ordered set of at least two binary bits in this stream (such an ordered set is sometimes denoted herein as an encoded multi-bit "data field").

A key aspect of the invention is that sense amplifier 15' encodes the data read from each memory cell of array 16' in a manner so that the encoded data output from sense amplifier 15' can be error corrected using implementations of units 41', 42', and 43' which require processing of a lower number of ECC check bits than required in prior art multistate memory systems to perform error detection and correction on the same number of data bits. In a class of preferred embodiments in which chip 3' is implemented as a four-state memory system (each element of array 16' is either in an erased state, or has been programmed to one of three non-erased states), sense amplifier 15' encodes the data read from each element as a field (an ordered set) of two binary bits. In another class of preferred embodiments in which chip 3' is implemented as an eight-state memory system (each element of array 16' is either in an erased state, or has been programmed to one of seven non-erased states), sense amplifier 15' encodes the data read from each element as a field (an ordered set) of three binary bits.

As explained, the bits written into memory array 16' are "ECC encoded" in the sense that they include ECC check bits (in addition to data bits of interest) which are written into some of the cells of array 16'. The ECC encoded data (including ECC check bits) written into the cells of array 16' have a well-defined format suitable for enabling error detection.

Figure 4:
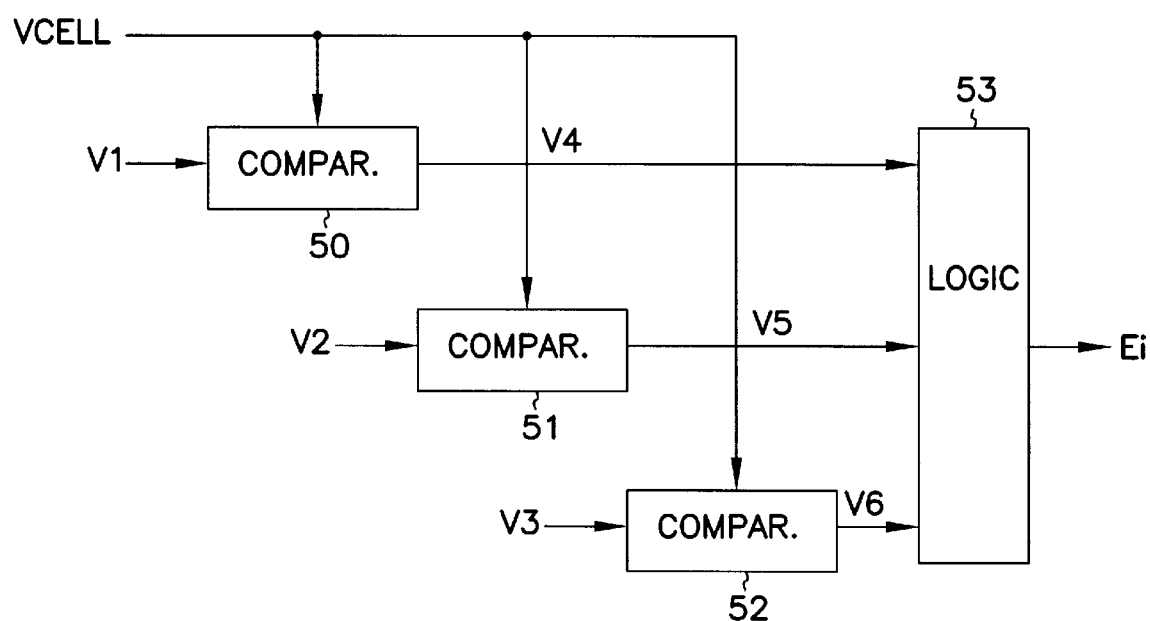
FIG. 4 is a block diagram of circuitry included within sense amplifier 15' of the FIG. 3 circuit.

When chip 3' is implemented as a four-state memory system (each cell of array 16' is either in an erased state, or has been programmed to one of three non-erased states) and a selected cell of array 16' is read, the cell will conduct a current (indicative of one of four possible states of the cell), and sense amplifier 15' converts this current to a voltage (voltage VCELL of FIG. 4).

The manner in which sense amplifier 15' determines the cell's state (in embodiments in which chip 3' is implemented as a four-state memory system), and generates encoded data (a field of binary bits) indicative of this state, will be described with reference to FIG. 4 (which is a block diagram of circuitry included within sense amplifier 15').

As shown in FIG. 4, sense amplifier 15' includes three comparator circuits (50, 51, and 52), each for comparing the voltage (VCELL) indicative of the cell state to a different reference voltage (V1, V2, or V3). Comparator 50 outputs voltage V4 which is either high or low (corresponding to a binary value of one or zero) depending on whether VCELL is less than or greater than reference voltage V1. Comparator 51 outputs voltage V5 which is either high or low (corresponding to a binary value of one or zero) depending on whether VCELL is less than or greater than reference voltage V2. Comparator 52 outputs voltage V6 which is either high or low (corresponding to a binary value of one or zero) depending on whether VCELL is less than or greater than reference voltage V3. Logic circuitry 53 receives voltage signals V4, V5, and V6, and asserts a signal $E_i$ indicative of an ordered set of two binary bits in response thereto. ECC decoder 41' receives and processes each signal $E_i$ asserted by circuit 15'. As explained, it is typical for a sequence of sets of elements of array 16' to be read in parallel, and decoder 41' receives and processes parallel binary bit streams consisting of a sequence of signals $E_i$, each signal $E_i$ representing a data bit (or ECC check bit) read from a different cell of memory array 16'.

Voltage VCELL is an analog voltage signal having a signal value in a value range, where the value range is a member of a sequence of non-overlapping value ranges $L_1H_1$, $L_2H_2$, $L_3H_3$, and $L_4H_4$. The value ranges are determined by low values $L_i$ and high values $H_i$ satisfying $L_1 < H_1 < V1 < L_2 < H_2 < V2 < L_3 < H_3 < V3 < L_4 < H_4$.

Each signal $E_i$ is indicative of an ordered set (field) of two binary bits as follows: $E_1$ is indicative of 00; $E_2$ is indicative of 01; $E_3$ is indicative of 11; and $E_4$ is indicative of 10. In one preferred implementation, each memory element of array 16' is a flash memory cell, each data bit read from one memory element (cell) is determined by an analog voltage signal in the range from 0 to 5 volts, and the four states of each cell are defined by the following subranges: $L_1$=0 volts, $H_1$=1.2 volts, $L_2$=1.25 volts, $H_2$=2.45 volts, $L_3$=2.5 volts, $H_3$=3.7 volts, $L_4$=3.75 volts, and $H_4$=5.0 volts.

For convenience, we refer to each signal $E_i$ as a "data field" of two binary bits (each indicative of an ordered set of two binary bits, where said binary bits are data bits of interest or ECC check bits), rather than as a signal indicative of such a data field.

In response to receiving a stream of data fields $E_i$, units 41', 42', and 43' operate as follows. Decoder 41' asserts uncorrected ones of the data fields $E_i$ which are indicative of data of interest to unit 42', and asserts syndrome bits to syndrome decoder 43'. Unit 43' decodes the syndrome bits to generate a set of correction bits in response to each set of syndrome bits that is indicative of a correctable error in the corresponding field. Decoder 43 asserts such set of correction bits to correction unit 42'. Unit 42' processes each set of correction bits with the corresponding uncorrected field to generate a corrected field, and asserts each corrected field to interface 10. Each corrected field output from unit 42' comprises original data bits (data bits received by unit 41' which were determined not to be erroneous) and replacement data bits (bits which replace those data bits received by unit 41' which were determined to be erroneous).

Decoder 43' asserts a failure signal in response to a set of syndrome bits indicative of non-correctable errors in the corresponding field. Only an error in a single bit of each field is treated as a correctable error. If the syndrome bits indicate an error in each of both bits of a field, such an error is treated as a non-correctable error in the corresponding field.

Each field is encoded so that an error in one of its bits results from a small error in the voltage VCELL from the relevant memory cell, whereas an error in both bits of a field results from a larger error in the voltage VCELL from the relevant memory cell.

In response to detecting a correctable error in a field $E_i$ of data of interest, unit 43' generates correction bits for correcting the error by changing one bit in the erroneous field $E_i$, and unit 42' processes the correction bits and the erroneous field $E_i$ to generate a corrected field (and unit 42' outputs the corrected field to interface 10).

By encoding the fields asserted to ECC decoder 41' as described, circuits 41'–43' implement an error correction and detection method in a manner that requires storage of a minimal number of ECC check bits in array 16' with the data of interest (i.e., fewer ECC check bits than must be stored in array 16 with the same data of interest, in order to implement error detection and correction according to the prior art). It should be appreciated that typical error detection and correction algorithms which correct as many as "m" errors in each set of "k" data bits require a number ("c") of ECC check bits which satisfies the following relation:

$2^c$ is greater than or equal to the quantity $[1+C(n,1)+C(n,2)+C(n,3)+ \ldots +C(n,m)]$, where n=c+k=the number of data bits and check bits received by the correction and detection circuitry, and the notation C(x,y) denotes C(x,y)=x!/[y!(x-y)!].

In view of this relation, it will be appreciated that if an error detection and correction algorithm which corrects only m=1 error (i.e., one erroneous bit) in a set of "k" data bits is adequate for a given application, such an algorithm will require processing of a smaller number ("n") of data bits and check bits (and thus a fewer number of check bits) than would an algorithm which corrects more than one error (i.e., two or more erroneous bits) in the same set of "k" data bits. The inventive encoding scheme (implemented by sense amplifier circuit 15' in the FIG. 3 embodiment) makes it unlikely that there will be more than one erroneous bit in each encoded field, and thus makes it tolerable to use an error detection and correction algorithm which corrects only one erroneous bit in each field. For this reason, the invention requires processing of fewer check bits (to perform error correction on any given number of the fields) than would be required if it were necessary (as in the prior art) to employ a scheme having the capability to correct more than one erroneous bit in each encoded field (in order to keep the rate of uncorrectable errors to a tolerably low level).

To better understand the inventive technique for encoding the data fields supplied to the error detection and correction circuitry, it may be helpful to appreciate that in the described example (in which the four states of each cell are defined by the subranges $L_1$=0 volts, $H_1$=1.2 volts, $L_2$=1.25 volts, $H_2$=2.45 volts, $L_3$=2.5 volts, $H_3$=3.7 volts, $L_4$=3.75 volts, and $H_4$=5.0 volts), voltage VCELL (from one cell) can vary by as much as 0.6 volt without changing the state of the cell (indicated by the encoded signal $E_i$). If voltage VCELL (from one cell) varies by substantially more than 0.6 volt (from its "correct" value), sense amplifier 15' detects a changed state of the cell (indicated by a different value of field $E_i$). Circuits 41', 42', and 43' are designed to assume that voltage VCELL (from one cell) will rarely vary by more than 1.2 volts from its "correct" value (which is a reasonable assumption). Thus, in response to detecting an error in one bit of a field $E_j$, units 41'–43' correct the error by changing one bit in the erroneous field $E_i$. The latter step can effectively replace data indicative of an erroneous voltage VCELL in range $L_1H_1$ (from 0 to 1.2 volts) by data indicative of a corrected voltage in range $L_2H_2$ (from 1.25 to 2.45 volts), or can effectively replace data indicative of an erroneous voltage VCELL in range $L_2H_2$ (from 1.25 to 2.45 volts) by data indicative of a corrected voltage in range $L_3H_3$ (from 2.5 to 3.7 volts), or can effectively replace data indicative of an erroneous voltage VCELL in range $L_3H_3$ (from 2.5 to 3.7 volts) by data indicative of a corrected voltage in range $L_4H_4$ (from 3.75 to 5.0 volts). In response to detecting an error in both bits of a field $E_i$ (which will be a rare event), units 41'–43' do not attempt to correct the error and instead assert a failure signal.

In alternative embodiments, the cells of multistate memory array 16' of FIG. 3 are controlled to have three states, or more than four states.

For example, each cell can be controlled to have eight states. In this case, sense amplifier 15' is implemented to generate each encoded signal $E_i$ to be indicative of an ordered set of three binary bits (for convenience in describing this example, we refer to such signal $E_i$ as an encoded "data field" of three binary bits or simply as an encoded "field"). In preferred implementations, each cell of array 16' is a flash memory cell, each data bit read from one cell is determined by an analog voltage signal (VCELL) in the range from 0 to 5 volts, and the eight states of each cell are defined by the following subranges: $L_1H_1$ from 0 to 0.6 volts, $L_2H_2$ from 0.61 to 1.2 volts, $L_3H_3$ from 1.21 to 1.8 volts, $L_4H_4$ from 1.81 to 2.4 volts, $L_5H_5$ from 2.41 to 3.0 volts, $L_6H_6$ from 3.01 to 3.6 volts, $L_7H_7$ from 3.61 to 4.2 volts, and $L_8H_8$ from 4.21 to 5.0 volts. In one embodiment in this class, the encoded fields $E_1$, $E_2$, $E_3$, $E_4$, $E_5$, $E_6$, $E_7$, and $E_8$ (corresponding respectively to subranges $L_1H_1$, $L_2H_2$, $L_3H_3$, $L_4H_4$, $L_5H_5$, $L_6H_6$, $L_7H_7$, and $L_8H_8$) consist of the binary bit sets 000, 001, 011, 010, 110, 111, 101, and 100, respectively. In another embodiment in this class, the encoded fields $E_1$, $E_2$, $E_3$, $E_4$, $E_5$, $E_6$, $E_7$, and $E_8$ are 000, 100, 101, 001, 111, 110, and 010, respectively. In each embodiment in this class, in response to detecting an error in one bit of such a three-bit field $E_i$, units 41'–43' correct the error by changing one bit in the erroneous field $E_i$. In response to detecting an error in two or more bits of a field $E_i$, units 41'–43' do not attempt to correct the error and instead assert a failure signal.

More generally, in accordance with the invention, a data bit is read from each memory element (cell) by asserting a signal (e.g., an analog voltage or current signal) having a signal value in a value range, where the value range is a member of a sequence of consecutively increasing but non-overlapping value subranges $L_iH_i$, where "i" is an integer in the range from 1 through N (where N is the number of states of each memory element, and N is equal to at least 3), and the value subranges are determined by low values $L_i$ and high values $H_i$ satisfying $L_1 < H_1 < L_2 < H_2 < \ldots < L_N < H_N$. Each value subrange $L_iH_i$ includes values $x_i$, where $L_i < x_i < H_i$. For each bit (identified by signal value subrange $L_iH_i$) read from a memory element, an encoded data signal $E_i$ is generated. Each encoded signal $E_i$ is indicative of an ordered set of bits (preferably binary bits). The encoded data signals $E_i$ satisfy the following criteria: $E_m$ is not identical to $E_n$ where "m" and "n" are different integers in the range from 1 through N; and for each pair of encoded signals $E_{j-1}$ and $E_j$ (where j is an integer in the range from 2 to N) indicative respectively of a first ordered set of bits and a second ordered set of bits, the second ordered set is generated by changing one bit of the first ordered set. Preferably also, for encoded signals $E_1$ and $E_N$, indicative respectively of a third ordered set of bits and a fourth ordered set of bits, the fourth ordered set is generated by changing one bit of the third ordered set. In response to detecting an error in one bit of the multi-bit field indicated by such a signal $E_i$, the error detection and correction circuitry of the invention correct the error by generating a corrected signal indicative of a change to one and only one bit of the erroneous multi-bit field. In response to detecting an error in two or more bits of the multi-bit field indicated by such a signal $E_i$, the error detection and correction circuitry of the invention do not attempt to correct the error and instead assert a failure signal.

In alternative embodiments, for each pair of encoded signals $E_{j-1}$ and $E_j$ (where j is an integer in the range from 2 to N) indicative respectively of a first ordered set of bits and a second ordered set of bits, the second ordered set is generated by changing X bits of the first ordered set (where X is an integer other than one). In such alternative embodiments, for encoded signals $E_1$ and $E_N$ indicative respectively of a third ordered set of bits and a fourth ordered set of bits, the fourth ordered set is preferably generated by changing X bits of the third ordered set.

In variations on the described embodiments, the error detection and correction circuitry of the invention receives and processes multi-bit encoded data fields, each field consisting of an ordered set of bits other than binary bits. In these alternative embodiments, the error detection and correction unit corrects each correctable detected error in a field by changing one bit (which is not a binary bit) in said field. But, in response to detecting an error in two or more bits of the field, the error detection and correction circuitry of the invention considers such an error as a non-correctable error, does not attempt to correct the error, and instead asserts a failure signal.

The methods implemented by the described apparatus (for encoding bits read from a multistate memory array thereby generating an encoded multi-bit field for the data read from each cell of the array, and for performing error detection and correction on the encoded fields) are within the scope of the invention.

Preferred embodiments of the method and system of the invention, and several variations thereon, have been described with reference to FIGS. 3 and 4. Although these embodiments have been described in some detail, it is contemplated that many changes from (and variations on) these embodiments can be made without departing from the scope of the invention as defined by the appended claims.

What is claimed is:

1. A method for encoding data read from a multistate memory array comprising cells, where each of the cells has 4 states, and each of the states is indicative of a different stored data bit, said method including:

generating data signals by reading selected ones of the cells, where each of the data signals has a value indicative of a data bit stored in a different one of the cells, each said value is in a range which is a member of a sequence of ranges $L_iH_i$, where I is an integer from 1 through 4, each said range $L_iH_i$ consisting of values $x_i$, where $L_i < x_i < H_i$, and where $L_1 < H_1 < L_2 < H_2 < \ldots < L_4 < H_4$;

encoding the data signals by replacing each of the data signals with an encoded data signal, where for each of the data signals whose value is in the range $L_iH_i$, the encoded data signal is an ordered set of binary bits $E_j$, $E_{j+1}$, $E_{j+2}$, $E_{j+3}$ are indicative, respectively, of ordered binary bit sets 00, 01, 11, and 10; and wherein $L_1$ is substantially equal to 0 volts, $H_1$ is substantially equal to 1.2 volts, $L_2$ is substantially equal to 1.25 volts, $H_2$ is substantially equal to 2.45 volts, $L_3$ is substantially equal to 2.5 volts, $H_3$ is substantially equal to 3.7 volts, $L_4$ is substantially equal to 3.75 volts, and $H_4$ is substantially equal to 5.0 volts.

2. The method of claim 1, also including:

performing error detection on the encoded data signals, thereby detecting an error in at least one of said encoded data signals; and correcting the error by changing one bit of the ordered set of bits indicated by said at least one of said encoded data signals.

3. A multistate memory system, including:

a memory array comprising cells, where each of the cells has 4 states, and each of the states is indicative of a different stored data bit;

a first circuit connected to the memory array and configured to read selected ones of the cells thereby generating data signals, where each of the data signals has a value indicative of a data bit stored in a different one of said selected ones of the cells, each said value is in a range which is a member of a sequence of ranges $L_i H_i$, where I is an integer from 1 through 4, each said range $L_i H_i$ consisting of values $x_i$, where $L_i < x_i H_i$, and where $L_1 < H_1 < L_2 < H_2 < \ldots < L_4 < H_4$;

an encoding unit connected to the first circuit and configured to encode the data signals by replacing each of said data signals with an encoded data signal, where for each of the data signals whose value is in the range $L_i H_i$, the encoded data signal is an ordered set of bits $E_1$, $E_2$, $E_3$, and $E_4$, and the ordered sets are indicative, respectively, of ordered binary bit sets 00, 01, 11, and 01; and where $L_1$ is substantially equal to 0 volts, $H_1$ is substantially equal to 1.2 volts, $L_2$ is substantially equal to 1.25 volts, $H_2$ is substantially equal to 2.45 volts, $L_3$ is substantially equal to 2.5 volts, $H_3$ is substantially equal to 3.7 volts, $L_4$ is substantially equal to 3.75 volts, and $H_4$ is substantially equal to 5.0 volts.

4. The system of claims 3, also including:

error detection and correction circuitry connected to the encoding unit and configured to perform error detection on the encoded data signals, thereby detecting an error in at least one of said encoded data signals and correcting the error by changing one bit of the ordered set of bits indicated by said at least one of said encoded data signals.

5. The memory system of claim 3, wherein said memory system is an integrated circuit, and each of said cells is a flash memory cell.

6. A multistate memory system, including:

a memory array comprising cells, where each of the cells has four states, each of the states is indicative of a different stored data bit, a first of the states is determined by a first voltage range $L_1 H_1$ between voltages $L_1$ and $H_1$, a second of the states is determined by a second voltage range $L_2 H_2$ between voltages $L_2$ and $H_2$, a third of the states is determined by a third voltage range $L_3 H_3$ between voltages $L_3$ and $H_3$, and a fourth of the states is determined by a fourth voltage range $L_4 H_4$ between voltages $L_4$ and $H_4$, where $L_1 < H_1 < L_2 < H_2 < L_3 < H_3 < L_4 < H_4$;

a first circuit connected to the memory array and configured to read selected ones of the cells thereby generating data signals, each of the data signals having a voltage in one of said voltage ranges $L_1 H_1$, $L_2 H_2$, $L_3 H_3$, and $L_4 H_4$; and an encoding unit connected to the first circuit and configured to encode the data signals by replacing each of said data signals with an encoded data signal, where for each of the data signals whose value is in the range $L_i H_i$, the encoded data signal is an ordered set of bits $E_i$, where I is an integer from 1 through 4, and where for each pair of ordered sets $E_{j-1}$ and $E_j$ indicative respectively of a first ordered set of bits and a second ordered set of bits, the second ordered set is generated by changing X bits of the first ordered set, where j is an integer in the range from 2 through 4, and X is an integer;

where $L_1$ is substantially equal to 0 volts, $H_1$ is substantially equal to 1.2 volts, $L_2$ is substantially equal to 1.25 volts, $H_2$ is substantially equal to 2.45 volts, $L_3$ is substantially equal to 2.5 volts, $H_3$ is substantially equal to 3.7 volts, $L_4$ is substantially equal to 3.75 volts, and $H_4$ is substantially equal to 5.0 volts.

7. The system of claim 6, also including:

error detection and correction circuitry connected to the encoding unit and configured to perform error detection on the encoded data signals, thereby detecting an error in at least one of said encoded data signals, and to correct the error by changing one bit of the ordered set of bits indicated by said at least one of said encoded data signals.

8. The memory system of claim 6, wherein each of said cells is a flash memory cell.

9. The memory system of claim 8, wherein said memory system is an integrated memory circuit.

10. A method for encoding data read from a multistate memory array comprising cells, where each of the cells has 8 states, and each of the states is indicative of a different stored data bit, the method including:

generating data signals by reading selected ones of the cells, where each of the data signals has a value indicative of a data bit stored in a different one of the cells, each the value is in a range which is a member of a sequence of ranges $L_i H_i$, where I is an integer from 1 through 8, each the range $L_i H_i$ consisting of values $x_i$, where $L_i < x_i < H_i$, and where $L_1 < H_1 < L_2 < H_2 < \ldots < L_8 < H_8$;

encoding the data signals by replacing each of the data signals with an encoded data signal, where for each of the data signals whose value is in the range $L_i H_i$, the encoded data signal is an ordered set of binary bits $E_j$, $E_{j+1}$, $E_{j+2}$, $E_{j+3}$, $E_{j+4}$, $E_{j+5}$, $E_{j+6}$ and $E_{j+7}$ are indicative, respectively, of ordered binary bit sets; and wherein $L_1$ is substantially equal to 0 volts, $H_1$ is substantially equal to 0.6 volts, $L_2$ is substantially equal to 0.61 volts, $H_2$ is substantially equal to 1.2 volts, $L_3$ is substantially equal to 1.21 volts, $H_3$ is substantially equal to 1.8 volts, $L_4$ is substantially equal to 1.81 volts, $H_4$ is substantially equal to 2.4 volts, $L_5$ is substantially equal to 2.41 volts, $H_5$ is substantially equal to 3.0 volts, $L_6$ is substantially equal to 3.01 volts, $H_6$ is substantially equal to 3.6 volts, $L_7$ is substantially equal to 3.61 volts, $H_7$ is substantially equal to 4.2 volts, $L_8$ is substantially equal to 4.21 volts, and $H_8$ is substantially equal to 5.0 volts.

11. The method of claim 10, wherein the ordered sets $E_j$, $E_{j+1}$, $E_{j+2}$, and $E_{j+3}$, $E_{j+4}$, $E_{j+5}$, $E_{j+6}$, and $E_{j+7}$ are indicative, respectively, of ordered binary bit sets 000, 001, 011, 010, 110, 111, 101, and 100.

12. The method of claim 10, wherein the ordered sets $E_j$, $E_{j+1}$, $E_{j+2}$, and $E_{j+3}$, $E_{j+4}$, $E_{j+5}$, $E_{j+6}$, and $E_{j+7}$ are indicative, respectively, of ordered binary bit sets 000, 100, 101, 001, 011, 111, 110, and 010, respectively.

13. The method of claim 10, also including the steps of:
performing error detection on the encoded data signals, thereby detecting an error in at least one of the encoded data signals.

14. A multistate memory system, including:
a memory array comprising cells, where each of the cells has 8 states, and each of the states is indicative of a different stored data bit;
a first circuit connected to the memory array and configured to read selected ones of the cells thereby generating data signals, where each of the data signals has a value indicative of a data bit stored in a different one of the selected ones of the cells, each the value is in a range which is a member of a sequence of ranges $L_iH_i$, where I is an integer from 1 through 8, each the range $L_iH_i$ consisting of values $x_i$, where $L_i<x_i<H_i$, and where $L_1<H_1<L_2<H_2< \ldots <L_8<H_8$;
an encoding unit connected to the first circuit and configured to encode the data signals by replacing each of the data signals with an encoded data signal, where for each of the data signals whose value is in the range $L_iH_i$, the encoded data signal is an ordered set of bits $E_j$, $E_{j+1}$, $E_{j+2}$, $E_{j+3}$, $E_{j+4}$, $E_{j+5}$, $E_{j+6}$ and $E_{j+7}$ are indicative, respectively, of ordered binary bit sets; and
wherein $L_1$ is substantially equal to 0 volts, $H_1$ is substantially equal to 0.6 volts, $L_2$ is substantially equal to 0.61 volts, $H_2$ is substantially equal to 1.2 volts, $L_3$ is substantially equal to 1.21 volts, $H_3$ is substantially equal to 1.8 volts, $L_4$ is substantially equal to 1.81 volts, $H_4$ is substantially equal to 2.4 volts, $L_5$ is substantially equal to 2.41 volts, $H_5$ is substantially equal to 3.0 volts, $L_6$ is substantially equal to 3.01 volts, $H_6$ is substantially equal to 3.6 volts, $L_7$ is substantially equal to 3.61 volts, $H_7$ is substantially equal to 4.2 volts, $L_8$ is substantially equal to 4.21 volts, and $H_8$ is substantially equal to 5.0 volts.

15. The system of claim 14, also including:
error detection and correction circuitry connected to the encoding unit and configured to perform error detection on the encoded data signals, thereby detecting an error in at least one of the encoded data signals and correcting the error by changing one bit of the ordered set of bits indicated by the at least one of the encoded data signals.

16. The memory system of claim 14, wherein the memory system is an integrated circuit, and each of the cells is a flash memory cell.

17. The memory system of claim 14, wherein the ordered sets $E_j$, $E_{j+1}$, $E_{j+2}$, and $E_{j+3}$, $E_{j+4}$, $E_{j+5}$, $E_{j+6}$, and $E_{j+7}$ are indicative, respectively, of ordered binary bit sets 000, 001, 011, 010, 110, 111, 101, and 100.

18. The memory system of claim 14, wherein the ordered sets $E_j$, $E_{j+1}$, $E_{j+2}$, and $E_{j+3}$, $E_{j+4}$, $E_{j+5}$, $E_{j+6}$, and $E_{j+7}$ are indicative, respectively, of ordered binary bit sets 000, 100, 101, 001, 011, 111, 110, and 010, respectively.

19. A multistate memory system, including:
a memory array comprising cells, where each of the cells has eight possible states, where each of the eight possible states has a value in a range which is a member of a sequence of ranges $L_iH_i$, where I is an integer from 1 through 8, each the range $L_iH_i$ consisting of values $x_i$, where $L_i<x_i<H_i$, and where $L_1<H_1<L_2<H_2< \ldots <L_8<H_8$;
a first circuit connected to the memory array and configured to read selected ones of the cells thereby generating data signals, each of the data signals having a voltage in one of the voltage ranges $L_1H_1$, $L_2H_2$, $L_3H_3$, $L_4H_4$; $L_5H_5$, $L_6H_6$, $L_7H_7$, and $L_8H_8$; and
an encoding unit connected to the first circuit and configured to encode the data signals by replacing each of the data signals with an encoded data signal, where for each of the data signals whose value is in the range $L_iH_i$, the encoded data signal is an ordered set of bits $E_j$, $E_{j+1}$, $E_{j+2}$, and $E_{j+3}$, $E_{j+4}$, $E_{j+5}$, $E_{j+6}$, and $E_{j+7}$;
wherein $L_1$ is substantially equal to 0 volts, $H_1$ is substantially equal to 0.6 volts, $L_2$ is substantially equal to 0.61 volts, $H_2$ is substantially equal to 1.2 volts, $L_3$ is substantially equal to 1.21 volts, $H_3$ is substantially equal to 1.8 volts, $L_4$ is substantially equal to 1.81 volts, $H_4$ is substantially equal to 2.4 volts, $L_5$ is substantially equal to 2.41 volts, $H_5$ is substantially equal to 3.0 volts, $L_6$ is substantially equal to 3.01 volts, $H_6$ is substantially equal to 3.6 volts, $L_7$ is substantially equal to 3.61 volts, $H_7$ is substantially equal to 4.2 volts, $L_8$ is substantially equal to 4.21 volts, and $H_8$ is substantially equal to 5.0 volts.

20. The system of claim 19, also including:
error detection and correction circuitry connected to the encoding unit and configured to perform error detection on the encoded data signals, thereby detecting an error in at least one of the encoded data signals, and to correct the error by changing one bit of the ordered set of bits indicated by the at least one of the encoded data signals.

21. The memory system of claim 19, wherein each of the cells is a flash memory cell.

22. The memory system of claim 19, wherein the memory system is an integrated memory circuit.

* * * * *

UNITED STATES PATENT AND TRADEMARK OFFICE
CERTIFICATE OF CORRECTION

PATENT NO. : 5,864,569

DATED : January 26, 1999

INVENTOR(S) : Frankie F. Roohparvar, Cupertino, Calif.

It is certified that error appears in the above-identified patent and that said Letters Patent is hereby corrected as shown below:

At Col. 15, line 27, please delete "$L_i\ H_i$ consisting of values $x_i$, where $L_i < x_i H_j$, and where" and insert -- $L_i\ H_i$ consisting of values $x_i$, where $L_i < x_i < H_j$, and where --

Signed and Sealed this

Eighth Day of February, 2000

*Attest:*

Q. TODD DICKINSON

*Attesting Officer*   *Commissioner of Patents and Trademarks*